United States Patent
Peng et al.

(10) Patent No.: US 10,923,513 B2
(45) Date of Patent: Feb. 16, 2021

(54) ARRAY SUBSTRATE AND METHOD FOR MANUFACTURING THE SAME, DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yong Peng, Beijing (CN); Pengju Zhang, Beijing (CN); Xin Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/346,025

(22) PCT Filed: Jun. 7, 2018

(86) PCT No.: PCT/CN2018/090248
§ 371 (c)(1),
(2) Date: Apr. 29, 2019

(87) PCT Pub. No.: WO2018/224003
PCT Pub. Date: Dec. 13, 2018

(65) Prior Publication Data
US 2019/0267410 A1    Aug. 29, 2019

(30) Foreign Application Priority Data
Jun. 9, 2017   (CN) .......................... 201710437465.7

(51) Int. Cl.
*H01L 27/12*   (2006.01)
*G02F 1/1362*   (2006.01)
(Continued)

(52) U.S. Cl.
CPC .... *H01L 27/1259* (2013.01); *G02F 1/136286* (2013.01); *H01L 27/124* (2013.01);
(Continued)

(58) Field of Classification Search
CPC .......... H01L 27/1259; H01L 29/41733; H01L 51/0508–057; H01L 27/3274;
(Continued)

(56) References Cited

U.S. PATENT DOCUMENTS

2004/0008314 A1* 1/2004 Hayashi .............. G02F 1/13452
349/158
2008/0296591 A1* 12/2008 Lin ................... H01L 27/14665
257/88
(Continued)

FOREIGN PATENT DOCUMENTS

CN    102394238 A    3/2012
CN    103164056 A    6/2013
(Continued)

OTHER PUBLICATIONS

International Search Report and Written Opinion issued in International Application No. PCT/CN2018/090248, dated Sep. 6, 2018, with English translation.
(Continued)

*Primary Examiner* — Cuong B Nguyen
(74) *Attorney, Agent, or Firm* — McDermott Will and Emery LLP

(57) ABSTRACT

A method for manufacturing an array substrate includes: forming a strip-shaped barrier wall(s) on a base substrate, wherein the width of each barrier wall is less than or equal
(Continued)

to a distance between a first metal trace to be formed and a second metal trace to be formed; and forming a first metal trace at one side of each barrier wall located in a direction perpendicular to an extending direction of the barrier wall, and forming a second metal trace at an opposite side of the barrier wall located in the direction perpendicular to the extending direction of the barrier wall.

12 Claims, 4 Drawing Sheets

(51) Int. Cl.
*H01L 29/417* (2006.01)
*G02F 1/1333* (2006.01)
*G06F 3/041* (2006.01)

(52) U.S. Cl.
CPC .... *H01L 29/41733* (2013.01); *G02F 1/13338* (2013.01); *G02F 2001/136295* (2013.01); *G06F 3/0412* (2013.01); *G06F 2203/04103* (2013.01)

(58) Field of Classification Search
CPC ............. H01L 27/124; G02F 1/136286; G02F 1/13338; G02F 2001/136295; G02F 1/1368; G06F 3/0412; G06F 2203/04103
See application file for complete search history.

(56) References Cited

U.S. PATENT DOCUMENTS

| | | | |
|---|---|---|---|
| 2011/0069246 A1* | 3/2011 | Wang | G02F 1/13624 349/42 |
| 2016/0252989 A1 | 9/2016 | Zhang et al. | |
| 2017/0012147 A1 | 1/2017 | Cheong | |
| 2018/0019291 A1* | 1/2018 | Morita | H01L 29/7869 |
| 2019/0267410 A1 | 8/2019 | Peng et al. | |
| 2019/0273164 A1 | 9/2019 | Chen et al. | |

FOREIGN PATENT DOCUMENTS

| | | |
|---|---|---|
| CN | 104238816 A | 12/2014 |
| CN | 106206612 A | 12/2016 |
| CN | 107300996 A | 10/2017 |

OTHER PUBLICATIONS

First Office Action issued in corresponding Chinese Application No. 201710437465.7, dated Mar. 5, 2019, with English translation.
Second Office Action issued in corresponding Chinese Patent No. 201710437465.7, dated Jul. 2, 2019, with English translation.

* cited by examiner

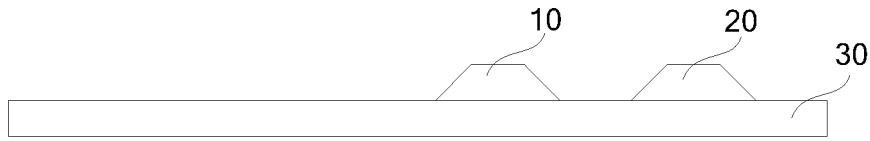
FIG. 1
FIG. 2
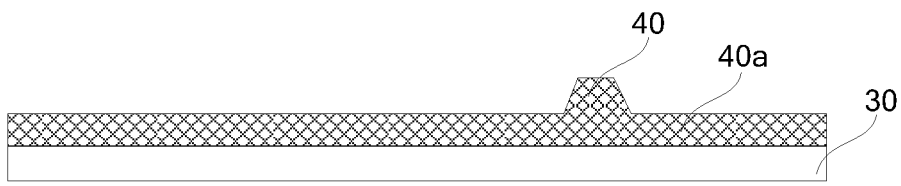
FIG. 3A
FIG. 3B
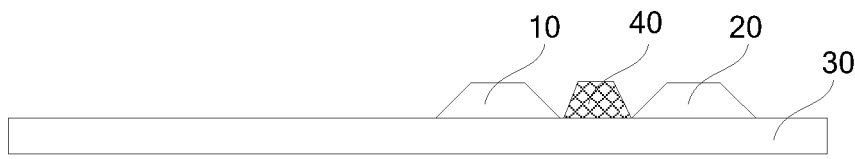
FIG. 4A

ARRAY SUBSTRATE AND METHOD FOR MANUFACTURING THE SAME, DISPLAY DEVICE

CROSS-REFERENCE TO RELATED APPLICATIONS

This application is a national phase entry under 35 USC 371 of International Patent Application No. PCT/CN2018/090248 filed on Jun. 7, 2018, which claims priority to Chinese Patent Application No. 201710437465.7, filed with the Chinese Patent Office on Jun. 9, 2017, titled "AN ARRAY SUBSTRATE AND METHOD FOR MANUFACTURING THE SAME, DISPLAY DEVICE", which are incorporated herein by reference in their entirety.

TECHNICAL FIELD

The present disclosure relates to the field of display technologies, and in particular, to an array substrate and a method for manufacturing the same, and a display device.

BACKGROUND

With the development of display technologies, the touch panel technologies have entered into a period of rapid development. The touch panels may be classified into out-cell touch panels and built-in touch panels according to the setting positions of the touch sensors. The built-in touch panels may be classified into on-cell touch panels and in-cell touch panels. The in-cell touch panels may also be classified into hybrid in cell (referred briefly to as HIC) touch panels and full in cell (referred briefly to as FIC) touch panels.

SUMMARY

In a first aspect, a method for manufacturing an array substrate is provided, and the manufacture method includes: forming strip-shaped barrier wall(s) on a base substrate, wherein, a width of each barrier wall is less than or equal to a distance between a first metal trace to be formed and a second metal trace to be formed; forming a first metal trace at one side of each barrier wall located in a direction perpendicular to an extending direction of the barrier wall, and forming a second metal trace at an opposite side of the barrier wall located in the direction perpendicular to the extending direction of the barrier wall.

Optionally, forming the strip-shaped barrier wall(s) on the base substrate, includes: forming an insulating thin film on the base substrate, and forming the strip-shaped barrier wall(s) via a patterning process; forming the first metal trace at one side of each barrier wall located in the direction perpendicular to the extending direction of the barrier wall, and forming the second metal trace at the opposite side of the barrier wall located in the direction perpendicular to the extending direction of the barrier wall, includes: forming a conductive thin film on the base substrate on which the barrier wall(s) have been formed, and forming the first metal trace at one side of each barrier wall and the second metal trace at the opposite side of the barrier wall located in the direction perpendicular to the extending direction of the barrier wall via coating photoresist, exposure, development and etching processes.

Optionally, forming the strip-shaped barrier wall(s) on the base substrate, includes: forming the strip-shaped barrier wall(s) on the base substrate via a printing process or an evaporation process; forming the first metal trace at one side of each barrier wall located in the direction perpendicular to the extending direction of the barrier wall, and forming the second metal trace at the opposite side of the barrier wall located in the direction perpendicular to the extending direction of the barrier wall, includes: forming the first metal trace at one side of each barrier wall and the second metal trace at the opposite side of the barrier wall located in the direction perpendicular to the extending direction of the barrier wall via a printing process or an evaporation process.

Optionally, each barrier wall has a continuous structure; or, each barrier wall includes at least two sub-barrier walls spaced apart, and the at least two sub-barrier walls are arranged in a strip shape.

Optionally, forming the insulating thin film on the base substrate via the patterning process, and forming the strip-shaped barrier wall(s) via the patterning process, includes: forming the insulating thin film on the base substrate, and thinning partial regions of the insulating thin film, wherein portion(s) of un-thinned remaining regions of the insulating thin film, which are protruded as compared to the regions that are thinned, form the strip-shaped barrier wall(s).

Optionally, a width of the barrier wall is equal to a distance between the first metal trace and the second metal trace.

Optionally, a thickness of the barrier wall is less than or equal to a thickness of the first metal trace and a thickness of the second metal trace.

Optionally, forming the first metal trace at one side of each barrier wall and the second metal trace at the opposite side of the barrier wall located in the direction perpendicular to the extending direction of the barrier wall via coating photoresist, exposure, development and etching processes, includes: forming source electrodes, drain electrodes, and the first metal trace at one side of each barrier wall and the second metal trace at the opposite side of the barrier wall, which are located in the direction perpendicular to the extending direction of the barrier wall, via coating photoresist, exposure, development and etching processes, wherein each source electrode is electrically connected to a corresponding first metal trace.

Optionally, before forming the insulating thin film on the base substrate, the method further includes: forming gate electrodes and a gate insulator on the base substrate in sequence; after forming the first metal trace and the second metal trace, the method further includes: forming a buffer layer and a planarization layer on the first metal trace and the second metal trace in sequence; forming first electrodes on the planarization layer, and each first electrode is electrically connected to a corresponding second metal trace via a via hole passing through the buffer layer and the planarization layer; forming a passivation layer on the first electrodes; forming second electrodes on the passivation layer, and each second electrode is electrically connected to a corresponding drain electrode via a via hole passing through the passivation layer, the planarization layer and the buffer layer.

A second aspect, an array substrate is provided, the array substrate includes: a base substrate; first metal traces and second metal traces, which are all disposed on the base substrate; and strip-shaped barrier wall(s) each disposed between one of the first metal traces and a corresponding one of the second metal traces, wherein a width of each barrier wall is less than or equal to a distance between the one of the first metal traces and the corresponding one of the second metal traces.

Optionally, each barrier wall has a continuous structure; or, each barrier wall includes at least two sub-barrier walls spaced apart, and the at least two sub-barrier walls are arranged in a strip shape.

Optionally, the array substrate further includes: an insulating thin film disposed on a surface of the base substrate; thicknesses of partial regions of the insulating thin film are less than thickness of remaining regions of the insulating thin film, and portion(s) of the remaining regions which are protruded as compared with the partial regions form the strip-shaped barrier wall(s); the first metal traces and the second metal traces are disposed on surfaces of the partial regions.

Optionally, a width of each barrier wall is equal to a distance between the one of the first metal traces and the corresponding respective one of the second metal traces.

Optionally, the array substrate further includes: source electrodes and drain electrodes which are disposed on a same layer as the first metal traces and the second metal traces, wherein the source electrodes are electrically connected to the first metal traces; and gate electrodes and a gate insulator which are disposed at one side of each first metal trace close to the base substrate and one side of each second metal trace close to the base substrate, wherein, the gate electrodes are disposed to be close to the base substrate.

Optionally, the array substrate further includes: a buffer layer, a planarization layer, first electrodes, a passivation layer and second electrodes sequentially disposed on the first metal traces and the second metal traces, wherein the first electrodes are electrically connected to the second metal traces via via holes passing through the buffer layer and the planarization layer; the second electrodes are electrically connected to the drain electrodes via via holes passing through the passivation layer, the planarization layer and the buffer layer.

In a third aspect, a display device is provided. The display device includes the array substrate according to any one of the above.

BRIEF DESCRIPTION OF THE DRAWINGS

FIG. 1 is a schematic diagram showing a structure of an array substrate provided by exemplary embodiments of the present disclosure;

FIG. 2 is a schematic flow chart of a method for manufacturing an array substrate provided by some embodiments of the present disclosure;

FIG. 3A is a first schematic diagram showing a structure of a barrier wall formed on a base substrate provided by some embodiments of the present disclosure;

FIG. 3B is a second schematic diagram showing a structure of a barrier wall formed on a base substrate provided by some embodiments of the present disclosure;

FIG. 4A is a schematic diagram showing a structure of an array substrate provided by some embodiments of the present disclosure;

DETAILED DESCRIPTION

Figure 4B:
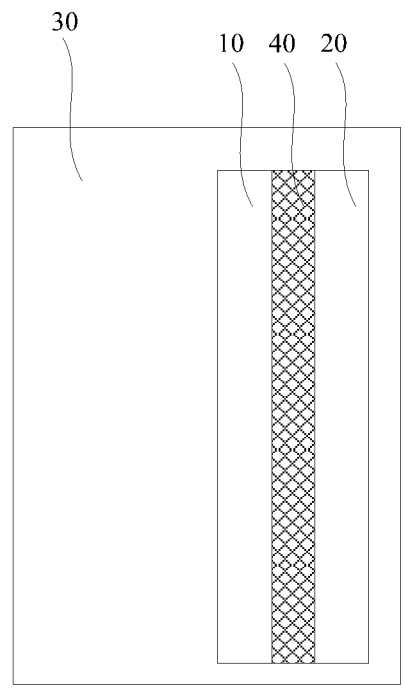
FIG. 4B is a schematic top view of the structure of the array substrate shown in FIG. 4A.

In some exemplary embodiments of the present disclosure, a FIC touch product, in which a touch sensor is built-in to a thin film transistor (referred briefly to as TFT), is provided to reduce the thickness of the display screen.

As shown in FIG. 1, in Touch and Display Driver Integration (TDDI) type touch products, since it is necessary to transmit touch signals to touch signal lines, in order to facilitate the transmissions of the touch signals, in a pixel area, the touch signal line 20 for transmitting the touch signal (e.g., a Tx signal) is generally arranged adjacent to a data line (Date) 10. The touch signal line 20 and the data line 10 are simultaneously formed on a base substrate 30.

However, for Pixels Per Inch (referred briefly to as PPI) touch products, since a width of a space between the touch signal line 20 and the data line 10 is small, it is easy to produce a poor effect in a process of manufacturing the touch signal line 20 and the data line 10.

Exemplarily, when the touch signal line 20 and the data line 10 are formed via a patterning process including coating photoresist, exposure, development and etching, during the process of exposing the photoresist, a problem of insufficient exposure easily occurs at the space between the touch signal line 20 to be formed and the data line 10 to be formed.

When a material of the photoresist is usually a positive photoresist, if the exposure is insufficient, the etching performed between the touch signal line 20 and the data line 10 is not thorough, so that the data line 10 is in contact with the adjacent touch signal line 20, that is, a short circuit occurs therebetween, thereby causing the poor effect.

If the photoresist at the space is overexposed (i.e., an originally preset exposure area is enlarged), widths of a formed data line 10 and a formed touch signal line 20 are resulted in being narrowed. In a fan-out area, since the data line 10 is narrower, the data line 10 is easy to break, thereby affecting the normal illumination of a column of pixels connected to the broken data line.

Some embodiments of the present disclosure provide a method for manufacturing an array substrate, and as shown in FIG. 2, the method includes the following steps.

In S100, as shown in FIG. 3A, a strip-shaped barrier wall 40 is formed on the base substrate 30. A width of the barrier wall 40 is less than or equal to a distance between a first metal trace to be formed and a second metal trace to be formed.

In S101, as shown in FIG. 4A, a first metal trace 10 is formed at one side of the barrier wall 40 located in a direction perpendicular to an extending direction of the barrier wall, and a second metal trace 20 is formed at the other side of the barrier wall 40 located in the direction perpendicular to the extending direction of the barrier wall.

A material of the insulating thin film is not limited, as long as it is a non-conductive material. For example, it may be at least one of $SiN_x$, $SiO_x$ or $SiO_xN_y$.

It will be noted that, the number of the barrier walls 40 formed is not limited, and may be set according to the design requirements of products.

Since the barrier wall 40 has a certain thickness, that is, the barrier wall has a three-dimensional structure, the poor effect may be prevented from being generated between the first metal trace 10 and the second metal trace 20, for example, the first metal trace 10 and the second metal trace 20 may be prevented from being in contact with each other etc., during a process of forming the first metal trace 10 and the second metal trace 20.

Therefore, in some embodiments, the number of the barrier walls 40 is the same as the number of the first metal traces 10 or the number of the second metal traces 20, that is, the barrier wall 40 is disposed between each first metal trace 10 to be formed and one of the second metal trace 20 to be formed that is adjacent to a corresponding first metal trace. In addition, the thickness of the formed barrier wall 40 is not limited, and the thickness of the barrier wall 40 may be the same as thicknesses of the first metal trace 10 to be formed and the second metal trace 20 to be formed, or may be less or larger than the thickness of the first metal trace 10 to be formed and the thickness of the second metal trace 20 to be formed.

Herein, since the first metal trace 10 and the second metal trace 20 are usually formed in a single one process, the thicknesses of the first metal trace and the second metal trace are the same.

Based on this, in the method for manufacturing the array substrate provided by some embodiments of the present disclosure, since the barrier wall 40 is formed on the base substrate before the first metal trace 10 and the second metal trace 20 are formed, and the width of the barrier wall 40 is less than or equal to the distance between the first metal trace 10 to be formed and the second metal trace 20 to be formed, when the first metal trace 10 and the second metal trace 20 are formed, the barrier wall 40 serve as a three-dimensional barrier structure, which may prevent short circuit from occurring between the first metal trace 10 and the second metal trace 20, for example, prevent the first metal trace 10 and the second metal trace 20 from being in contact with each other etc., due to the influence of the manufacturing process.

In some embodiments, the width of the barrier wall 40 is equal to the distance between the first metal trace 10 and the second metal trace 20.

In some embodiments, the above S100 includes the following step.

Referring to FIG. 3A, an insulating thin film is formed on the base substrate 30, and the strip-shaped barrier wall 40 is formed via the patterning process.

The above S101 includes the following step.

Figure 5:
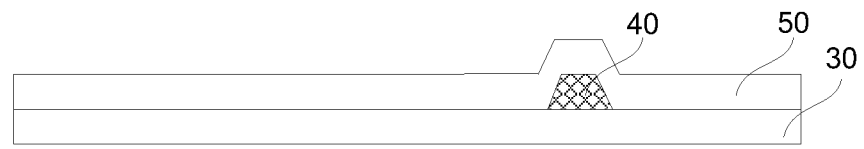
FIG. 5 is a schematic diagram showing a structure of a conductive thin film formed on a barrier wall provided by some embodiments of the present disclosure.

As shown in FIG. 5, a conductive thin film is formed on the barrier wall 40. As shown in FIG. 4A, the first metal trace 10 is formed at one side of the barrier wall 40 located in the direction perpendicular to the extending direction of the barrier wall 40, and the second metal trace 20 is formed at the other side of the barrier wall 40 located in the direction perpendicular to the extending direction of the barrier wall 40 via coating photoresist, exposure, development and etching processes.

It will be noted that, a material of the conductive thin film is not limited, as long as it may be conductive. For example, the conductive thin film may be, at least one of an elemental metal, an alloy, or a metal oxide.

The above patterning processes may include coating photoresist, exposure, development and etching.

In this way, since the photoresist is usually a positive photoresist, if the exposure at the space between the first metal trace 10 and the second metal trace 20 is insufficient, the photoresist will partially remain between the first metal trace 10 and the second metal trace 20 after the development, so that a portion of the conductive thin film 50 between the first metal trace 10 and the second metal trace 20 is not completely etched, thereby causing the first metal trace 10 and the second metal trace 20 to be in contact with each other and thus causing a short circuit. However, in the embodiments of the present disclosure, the barrier wall 40 is firstly formed before forming the first metal trace 10 and the second metal trace 20, and thus when the conductive thin film 50 is formed on the barrier wall 40, a height of a portion of the conductive thin film 50 disposed on the barrier wall 40 is higher than a height of other regions of the conductive thin film 50. In this way, after coating photoresist, a height of a portion of the photoresist above the barrier wall 40 is higher than that of other regions of the photoresist, and thus in the exposure process, the exposure for a region directly facing the barrier wall 40 may be enhanced, so that the region directly facing the barrier wall 40 is sufficient exposed, thereby solving the problem of insufficient exposure for the space between first metal trace 10 and the second metal trace 20.

That is, the formed barrier wall 40 may enhance the exposure at the space between the first metal trace 10 and the second metal trace 20, and thus in the case where the widths of the first metal trace 10 and the second metal trace 20 are ensured, the photoresist is prevented from remaining between the first metal trace 10 and the second metal trace 20. Accordingly, a portion of the conductive thin film disposed between the first metal trace 10 to be formed and the second metal trace 20 to be formed may be completely etched, thereby reducing the risk that the first metal trace 10 is in contact with the second metal trace 20 and the risk that the short circuit occurs. In some embodiments, the steps, in which the insulating thin film is formed on the base substrate 30 and the strip-shaped barrier wall 40 is formed via the patterning process, may include the following step.

Referring to FIG. 3B, an insulating thin film 40a is formed on the base substrate 30, and partial regions of the insulating thin film 40a are thinned. A portion of a remaining un-thinned region of the insulating thin film 40a, which is protruded as compared to the partials region that are thinned, forms the strip-shaped barrier wall 40.

Here, a treatment for thinning may exemplarily include processes such as dry etching etc., so as to reduce the thicknesses of the partial regions of the insulating thin film 40a.

That is, the structure shown in the foregoing FIG. 3A is that the partial regions of the insulating thin film are completely removed, so that the remaining portion of the insulating thin film forms the strip-shaped barrier wall 40. A structure shown in FIG. 3B is that the thicknesses of the partial regions of the insulating thin film are reduced, so that a region, the thickness of which is unchanged, is protruded as compared to the region, the thickness of which is reduced, and the portion that is protruded forms the strip-shaped barrier wall 40.

In some embodiments of the present disclosure, when the width of the barrier wall 40 is less than the distance between the first metal trace 10 and the second metal trace 20, only the height of a portion of the conductive thin film 50 on the barrier wall 40 is higher than the height of other regions of the conductive thin film when the conductive thin film 50 is formed on the barrier wall 40, and a height of a portion of the conductive thin film disposed between the first metal trace 10 to be formed and the barrier wall 40 and a height of a portion of the conductive thin film disposed between the second metal trace 20 to be formed and the barrier wall 40 are not changed. Accordingly, there is still a problem that the photoresist remains between the first metal trace 10 to be formed and the barrier wall 40 and remains between the second metal trace 20 to be formed and the barrier wall 40, and thus the portion of the conductive thin film disposed between the first metal trace 10 to be formed and the barrier wall 40 and the portion of the conductive thin film disposed between the second metal trace 20 to be formed and the barrier wall 40 are resulted in being not completely etched, so that the widths of a formed first metal trace 10 and a formed second metal trace 20 are finally greater than the widths the formed first metal trace and the formed second metal trace which are originally set, and thereby the distance between the formed first metal trace 10 and the formed second metal trace 20 is smaller.

When the distance between the first metal trace 10 and the second metal trace 20 is smaller, a signal transmitted on the first metal trace 10 and a signal transmitted on the second metal trace 20 are easily resulted in interfering with each other. Therefore, in some embodiments, referring to FIGS. 4A to 4C, the width of the barrier wall 40 is equal to the distance between the first metal trace 10 and the second metal trace 20.

In this way, since the width of the barrier wall 40 is equal to the distance between the first metal trace 10 and the second metal trace 20, one portion of the photoresist located between the first metal trace 10 to be formed and the second metal trace 20 to be formed may be sufficiently exposed after the photoresist is formed on the conductive thin film. Thus, a portion of the conductive thin film between the first metal trace 10 to be formed and the second metal trace 20 to be formed may be completely etched, thereby preventing the widths of the formed first metal trace 10 and the formed second metal trace 20 from being increased, and further reducing the risk that the short circuit occurs between the first metal trace 10 and the second metal trace 20 due to the contact therebetween.

In some embodiments, the above S100 may include the following step.

The strip-shaped barrier wall is formed on the base substrate via a printing process or an evaporation process.

The above S101 may include the following step.

The first metal trace is formed at one side of the barrier wall located in the direction perpendicular to the extending direction of the barrier wall via the printing process or the evaporation process, and the second metal trace is formed at the other side of the barrier wall located in the direction perpendicular to the extending direction of the barrier wall via the printing process or the evaporation process.

That is, the above strip-shaped barrier wall, the first metal trace and the second metal trace are formed via the printing processes or the evaporation processes.

The specific procedure of the printing process or the evaporation process may be with reference to related technologies, which will not be described herein again.

In this way, if the above barrier wall is not provided at the space between the first metal trace and the second metal trace, when the first metal trace and the second metal trace are formed by adopting the printing process or the evaporation process, since the space between the first metal trace to be formed and the second metal trace to be formed is set to be small, after a slight deviation occurs during the printing process or the evaporation process, the printing material or the evaporation material drips at the space, which easily causes the first metal trace to come into contact with the second metal trace.

However, in some embodiments, the above barrier wall is provided, and the barrier wall having a three-dimensional structure having the certain thickness is utilized, so that even when the printing material or the evaporation material drips on the surface of the barrier wall, it is difficult to directly connect the first metal trace and the second metal trace together, thereby preventing the short circuit from occurring between the first metal trace and the second metal trace.

Figure 4C:
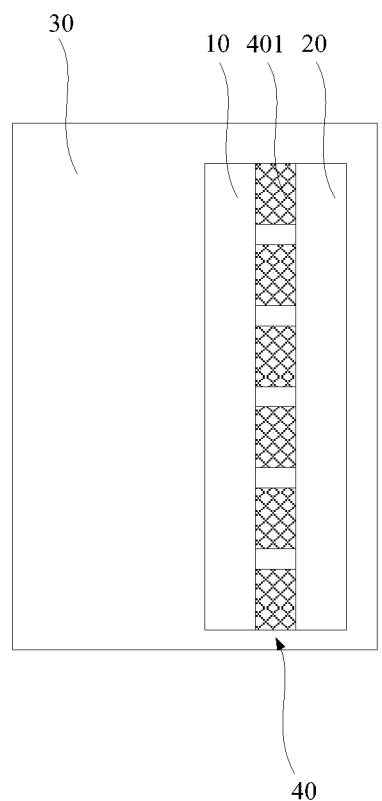
FIG. 4C is another schematic top view of the structure of the array substrate shown in FIG. 4A.

Further, as shown in FIG. 4B, the barrier wall 40 has a continuous structure; or as shown in FIG. 4C, the barrier wall 40 includes at least two sub-barrier walls 401 spaced apart, and the at least two sub-barrier walls 401 are arranged in a strip shape.

FIG. 4C only illustrates the case where the barrier wall 40 includes six sub-barrier walls 401 spaced apart, and the specific number and specific shapes of the sub-barrier walls 401 are not limited in the present disclosure, as long as at least two sub-barrier walls 401 are arranged in the strip shape.

In some embodiments, referring to FIG. 4B or 4C, a length of the barrier wall 40 is equal to a length of the first metal trace 10 to be formed or a length of the second metal trace 20 to be formed.

That is, for the structure shown in FIG. 4B, the barrier wall 40 is a continuous overall structure, and a length of the whole structure is equal to the length of the first metal trace 10 or the length of the second metal trace 20. For the structure shown in FIG. 4C, along the extending direction of the first metal trace 10 or the extending direction of the second metal trace 20, a length of a strip-shaped overall structure, which includes the at least two sub-barrier walls 401 and the space between adjacent two sub-barrier walls 401, is equal to the length of the first metal trace 10 or the length of the second metal trace 20. In some embodiments, in order to ensure a flatness of the formed array substrate, the thickness of the barrier wall 40 is less than or equal to the thickness of the first metal trace 10 and the thickness of the second metal trace 20.

The thickness of the first metal trace 10 is equal to that of the second metal trace 20.

In some embodiments, the step, in which the first metal trace 10 is formed at one side of the barrier wall 40 located in the direction perpendicular to the extending direction of the barrier wall, and the second metal trace 20 is formed at the other side of the barrier wall 40 located in the direction perpendicular to the extending direction of the barrier wall via coating photoresist, exposure, development and etching, specifically includes the following step.

Figure 6:
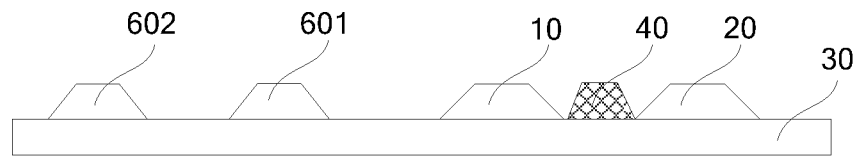
FIG. 6 is another schematic diagram showing a structure of an array substrate provided by some embodiments of the present disclosure.

As shown in FIG. 6, by performing coating photoresist, exposure, development and etching, a source electrode 601 and a drain electrode 602 are formed, the first metal trace 10 is formed at one side of the barrier wall 40 located in the direction perpendicular to the extending direction of the barrier wall, and the second metal trace 20 is formed at the other side of the barrier wall 40 located in the direction perpendicular to the extending direction of the barrier wall. The source electrode 601 is electrically connected to the first metal trace 10. The source electrode 601 is electrically connected to the first metal trace 10, and the first metal trace 10 is a data line. Here, due to the limitation of a cross-sectional direction, a portion of the source electrode 601 electrically connected to the first metal trace 10 is not illustrated in the above FIG. 6.

In addition, the structure in FIG. 6 is only described by taking the barrier wall 40 being directly formed on the base substrate 30 as an example.

Referring to FIG. 3B, the strip-shaped barrier wall 40 may also be the portion of the un-thinned remaining region of the insulating thin film 40*a* which is protruded as compared to the partial regions that are thinned, that is, the source electrode 601 and the drain electrode 602 may also be formed on the partial regions of the insulating thin film 40*a* which is thinned as shown in FIG. 3B.

It will be noted that, thin film transistors formed in the array substrate provided by embodiments of the present disclosure may be top-gate type thin film transistors, and also be bottom-gate type thin film transistors.

When the thin film transistor is the top-gate type thin film transistor, after forming the source electrode 601 and the drain electrode 602, the manufacturing method may further include the following step.

A gate insulator and a gate electrode are formed on the source electrode 601 and the drain electrode 602 in sequence.

When the thin film transistor is the bottom-gate type thin film transistor, after forming the source electrode 601 and the drain electrode 602, the manufacturing method may further include the following step.

The gate electrode and the gate insulator are formed on the base substrate 30 in sequence.

In some embodiments, after forming the conductive thin film 50 on the barrier wall 40, the first metal trace 10, the second metal trace 20, the source electrode 601 and the drain electrode 602 are simultaneously formed via coating photoresist, exposure, development and etching, thereby simplifying the manufacturing process of the array substrate.

In some embodiments, before S100, the manufacturing method further includes the following step.

Figure 7:
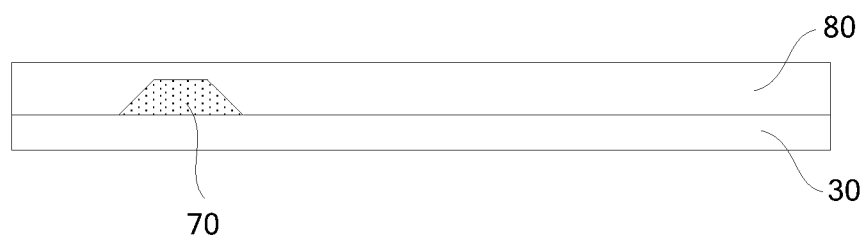
FIG. 7 is a schematic diagram showing a structure of a gate electrode and a gate insulating layer formed on a base substrate provided by some embodiments of the present disclosure.

As shown in FIG. 7, a gate electrode 70 and a gate insulator (referring briefly to as GI) 80 are formed on the base substrate 30 in sequence.

A material of the gate electrode 70 is not limited, as long as it may be conductive.

Exemplarily, the material of the gate electrode 70 may be at least one of the elemental metal, the alloy, or the metal oxide.

Here, a material of the gate insulator 80 is not limited, as long as it is an insulating material, for example, it may be at least one of silicon nitride, silicon oxide or silicon oxynitride.

It will be noted that, the gate electrode 70 and the gate insulator 80 are formed before the first metal trace 10, the second metal trace 20, the source electrode 601 and the drain electrode 602 are formed. In this case, the formed thin film transistor is the bottom-gate type thin film transistor.

The thin film transistor further includes an active layer (each of above figures of the embodiments of the present disclosure does not shows the active layer), and the active layer is in contact with both the source electrode 601 and the drain electrode 602.

Here, the active layer may be formed before forming the barrier wall 40; or the active layer may be formed after forming the barrier wall 40 and before forming the first metal trace 10 and the second metal trace 20; or the active layer may be formed after forming the first metal trace 10 and the second metal trace 20.

After S101, the above manufacturing method further includes the following step.

Figure 8:
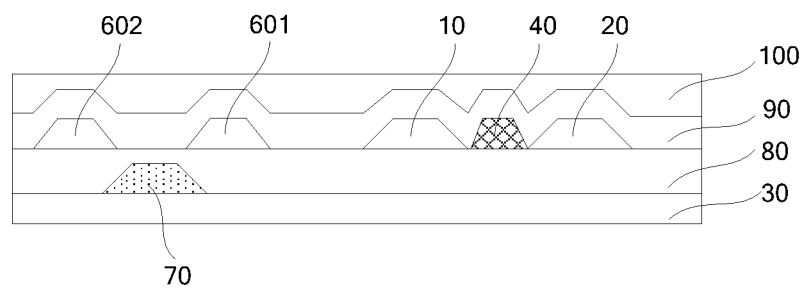
FIG. 8 is a schematic diagram showing a structure of yet another array substrate provided by some embodiments of the present disclosure.

In S200, as shown in FIG. 8, a buffer layer 90 and a planarization layer 100 are formed on the first metal trace 10 and the second metal trace 20 in sequence.

A material of the buffer layer 90 and a material of the planarization layer 100 are both insulating materials.

The material of the buffer layer 90 may be, for example, at least one of $SiO_2$, $TiO_2$, or $CeO_2$.

The material of the planarization layer 100 may be, for example, resin.

Here, the buffer layer 90 and the planarization layer 100 may be exemplarily formed via a vapor deposition method.

Figure 9:
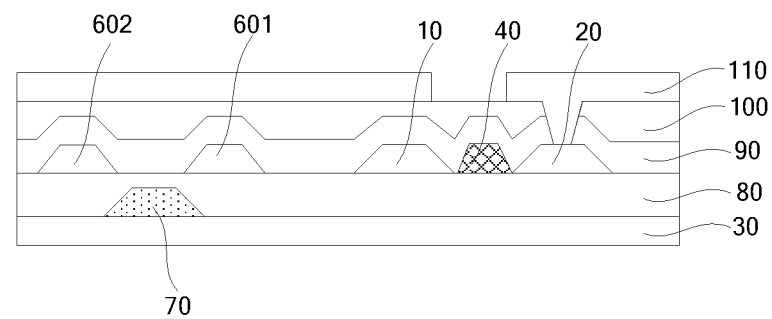
FIG. 9 is yet another schematic diagram showing a structure of an array substrate provided by some embodiments of the present disclosure.

In S201, as shown in FIG. 9, a first electrode 110 is formed on the planarization layer 100, and the first electrode 110 is connected to the second metal trace 20 via a via hole passing through both the buffer layer 90 and the planar layer 100.

The first electrode 110 may be exemplarily constituted by a plurality of bulk-shaped sub-electrodes, and the first electrode 110 may be used to implement both displaying and touching functions by time-multiplexing the first electrode 110.

The first electrode 110 is electrically connected to the second metal trace 20, and the second metal trace 20 is a touch signal line and used to transmit a touch signal to the first electrode 110.

When the array substrate is an array substrate in a liquid crystal display device, the above first electrode 110 may specifically be a common electrode (Vcom).

Here, in order to not to affect the display, the first electrode 110 may be, for example, a transparent electrode, and a material of the first electrode 110 may be, for example, at least one of indium tin oxide (ITO), indium zinc oxide (IZO) or fluorine-doped tin oxide (FTO).

Figure 10:
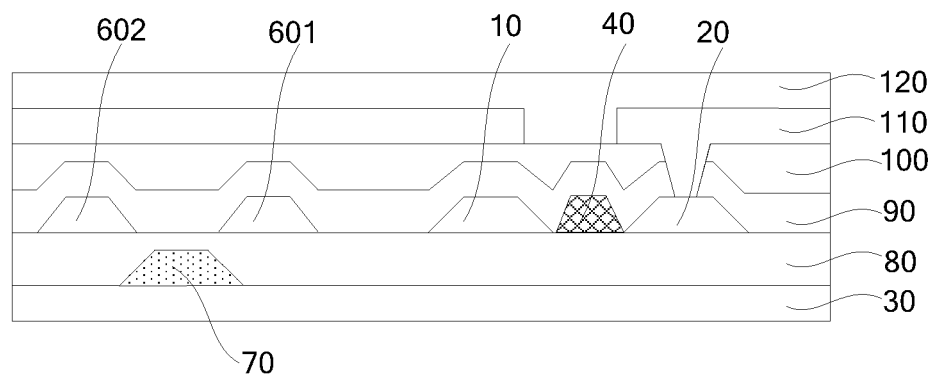
FIG. 10 is yet still another schematic diagram showing a structure of an array substrate provided by some embodiments of the present disclosure.

In S202, as shown in FIG. 10, a passivation layer (PVX) 120 is formed on the first electrode 110.

A material of the passivation layer 120 is not limited, and it may be, for example, at least one of silicon nitride, silicon oxide or silicon oxynitride.

Here, the formation process of the passivation layer 120 is not limited, and it may be, for example, formed by a sputtering method or a deposition method.

Figure 11:
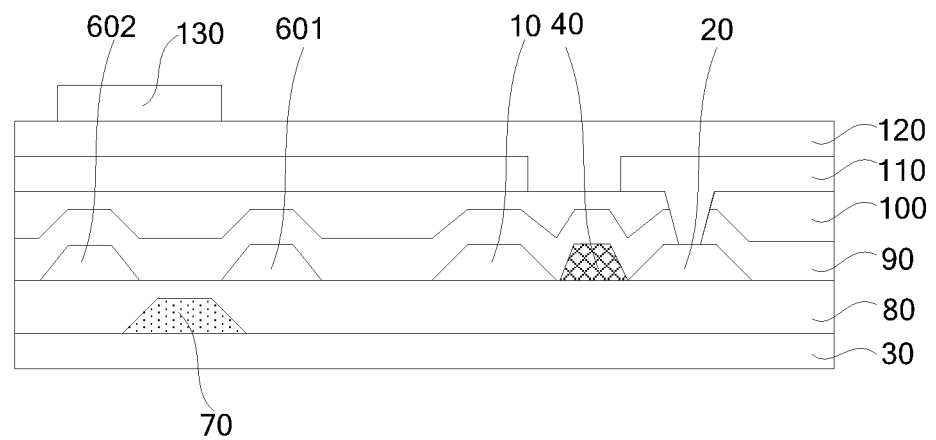
FIG. 11 is yet still another schematic diagram showing a structure of an array substrate provided by some embodiments of the present disclosure.

In S203, as shown in FIG. 11, a second electrode 130 is formed on the passivation layer 120, and the second electrode 130 is electrically connected to the drain electrode 602 via a via hole passing through the passivation layer 120, the planarization layer 100 and the buffer layer 90.

It will be noted that, the first electrode 110 is constituted by a plurality of bulk-shaped sub-electrodes, and therefore the second electrode 130 may be electrically connected to the drain electrode 602 through a gap between the bulk-shaped sub-electrodes in the first electrode 110.

Here, in FIG. 11, since a portion of the first electrode 110 is shown beneath the second electrode 130, and the via hole passing through the passivation layer 120, the planarization layer 100 and the buffer layer 90 may not pass through the first electrode 110, the via hole passing through the passivation layer 120, the planarization layer 100 and the buffer layer 90 are not shown, which limited by the cross-sectional direction in FIG. 11.

However, those skilled in the art will be able to clearly understand that, the second electrode 130 is electrically connected to the drain electrode 602 via the via hole passing through the passivation layer 120, the planarization layer 100 and the buffer layer 90.

Here, a material of the second electrode 130 may be, for example, a transparent material, such as, at least one of the ITO, IZO or FTO.

The material of the second electrode 130 and the material of the first electrode 110 may be the same or different.

When the array substrate shown in the above embodiments is specifically the array substrate of the liquid crystal display device, the second electrode 130 is electrically connected to the drain electrode 602, and the second electrode 130 is a pixel electrode.

In some embodiments of the present disclosure, a touch electrode (i.e. the first electrode 110) is built-in to the array substrate, and thus an In-cell touch substrate may be formed, thereby reducing a thickness of the array substrate.

Some embodiments of the present disclosure provide an array substrate, and as shown in FIG. 4A, the array substrate includes a base substrate 30, and a first metal trace 10 and a second metal trace 20 disposed on the base substrate 30; and a strip-shaped barrier wall 40 disposed between the first metal trace 10 and the second metal trace 20. A width of the barrier wall 40 is less than or equal to a distance between the first metal trace 10 and the second metal trace 20.

In some embodiments, the above array substrate further includes an insulating thin film 40a disposed on a surface of the base substrate 30 as shown in FIG. 3B. Thicknesses of partial regions of the insulating thin film 40a are less than the thickness of a remaining region thereof, and a portion of the remaining region that is protruded as compared to the partial regions forms the above strip-shaped barrier wall 40. The first metal trace 10 and the second metal trace 20 are disposed on the surface of the partial regions.

In some embodiments, as shown in FIG. 4B, the barrier wall 40 has a continuous structure; or as shown in FIG. 4C, the barrier wall 40 includes at least two sub-barrier walls 401 spaced apart, and the at least two sub-barrier walls 401 are arranged in a strip shape. The material of the barrier wall 40 is not limited in the present disclosure, as long as it is an insulating non-conductive material. For example, it may be at least one of silicon nitride, silicon oxide or silicon oxynitride.

It will be noted that, the function of providing the barrier wall 40 is to prevent the poor effect from occurring between the first metal trace 10 and the second metal trace 20 during the formation of the first metal trace 10 and the second metal trace 20. For example, a portion of the photoresist disposed at the space between the first metal trace 10 to be formed and the second metal trace 20 to be formed is sufficiently exposed, thereby preventing the poor effect from occurring between the formed first metal trace 10 and the formed second metal trace 20.

Therefore, in some embodiments, a length of the barrier wall 40 is equal to a length of the first metal trace 10 to be formed or a length of the second metal trace 20 to be formed.

In addition, a thickness of the barrier wall 40 is not limited. The thickness of the barrier wall 40 may be the same as a thickness of the first metal trace 10 and a thickness of the second metal trace 20, or may be less or greater than the thickness of the first metal trace 10 and the thickness of the second metal trace 20.

Since the first metal trace 10 and the second metal trace 20 are usually formed in a single one process, the thickness of the first metal trace 10 and the thickness of the second metal trace 20 are the same.

A material of the first metal trace 10 and a material of the second metal trace 20 are not limited, as long as they can be conductive. The material may be, for example, at least one of the elemental metal, the alloy, or the metal oxide.

Taking the first metal trace 10 and the second metal trace 20 being formed by a patterning process including coating photoresist, exposure, development and etching as an example, embodiments of the present disclosure provide an array substrate. Since the barrier wall 40 is formed on the base substrate 30 before forming the first metal trace 10 and the second metal trace 20, and the width of the barrier 40 is less than or equal to the distance between the first metal trace 10 to be formed and the second metal trace 20 to be formed, when a conductive thin film (the conductive thin film is used to form the first metal trace 10 and the second metal trace 20 via etching) is further formed, the height of a portion of the conductive thin film covering the barrier wall 40 is higher than that of other regions of conductive thin film.

In this way, after coating photoresist on the conductive thin film, the height of a portion of the photoresist disposed above the barrier wall 40 is also higher than the height of other regions of the photoresists, and therefore, in the exposure process, the exposure of a portion of the photoresist in the region directly facing the barrier wall 40 may be enhanced, and a portion of the photoresist in the region directly facing the barrier wall 40 is sufficiently exposed, thereby solving the problem of insufficient exposure of the portion of the photoresist at the space between the first metal trace 10 to be formed and the second metal trace 20 to be formed.

Since the photoresist is usually a positive photoresist, if the portion of the photoresist at the space between the first metal trace 10 to be formed and the second metal trace 20 to be formed is insufficiently exposed, after the photoresist is developed, a partial photoresist remains between the first metal trace 10 to be formed and the second metal trace 20 to be formed. As a result, a portion of the conductive thin film located between the first metal trace 10 to be formed and the second metal trace 20 to be formed is incompletely etched, which easily leads to the short circuit between the formed first metal trace 10 and the formed second metal trace 20.

In the above array substrate, the exposure of the portion of photoresist at the space between the first metal trace 10 to be formed and the second metal trace 20 to be formed is enhanced by providing the barrier wall 40, thereby preventing the photoresist from remaining between the first metal trace 10 to be formed and the second metal trace 20 to be formed in the case of ensuring that the first metal trace 10 to be formed and the second metal trace 20 to be formed have a proper line width. Therefore, when the conductive thin film is etched, the portion of the conductive thin film located between the first metal trace 10 to be formed and the second metal trace 20 to be formed may be completely etched, thereby reducing the risk that the short circuit occurs between the formed first metal trace 10 and the formed second metal trace 20 due to the contact of the first and second metal traces.

When the width of the barrier wall 40 is less than the distance between the first metal trace 10 and the second metal trace 20, after the conductive thin film is formed on the barrier wall 40, only the height of the portion of the conductive thin film disposed on the barrier wall 40 is higher than those of other regions, and a height of the portion of the conductive thin film located between the first metal trace 10 to be formed and the barrier wall 40, and a height of the portion of the conductive thin film located between the second metal trace 20 to be formed and the barrier wall 40 are not changed. Therefore, there is still a problem that portions of the photoresist are remained between the first metal trace 10 to be formed and the barrier wall 40 and between the second metal trace 20 to be formed and the barrier wall 40 respectively, thereby resulting in that the portion of the conductive thin film located between the first metal trace 10 to be formed and the barrier wall 40 and the portion of the conductive thin film located between the second metal trace 20 to be formed and the barrier wall 40 are not completely etched. So, the widths of the formed first metal trace 10 and the formed second metal trace 20 are wider, that is, the distance between the formed first metal trace 10 and the formed second metal trace 20 is smaller. When the distance between the first metal trace 10 and the second metal trace 20 is smaller, it is easily resulted in that a signal transmitted on the first metal trace 10 and a signal transmitted on the second metal trace 20 interfer with each other.

Therefore, in some embodiments of the present disclosure, referring to FIG. 4A, the width of the barrier wall 40 is equal to the distance between the first metal trace 10 and the second metal trace 20.

In this way, since the width of the barrier wall 40 is equal to the distance between the first metal trace 10 and the second metal trace 20, the portion of the photoresist located between the first metal trace 10 to be formed and the second metal trace 20 to be formed may be sufficiently exposed, so that the portion of the conductive thin film located between the first metal trace 10 to be formed and the second metal trace 20 to be formed may be completely etched, thereby avoiding to increase the widths of both the formed first metal trace 10 and the formed second metal trace 20, and further reducing the risk that the short circuit occurs between the first metal trace 10 and the second metal trace 20 due to the contact of the first and second metal traces.

In order to ensure the flatness of the formed array substrate, in some embodiments of the present disclosure, the thickness of the barrier wall 40 is less than or equal to the thickness of the first metal trace 10 and the thickness of the second metal trace 20.

The thickness of the first metal trace 10 is equal to that of the second metal trace 20.

Figure 12:
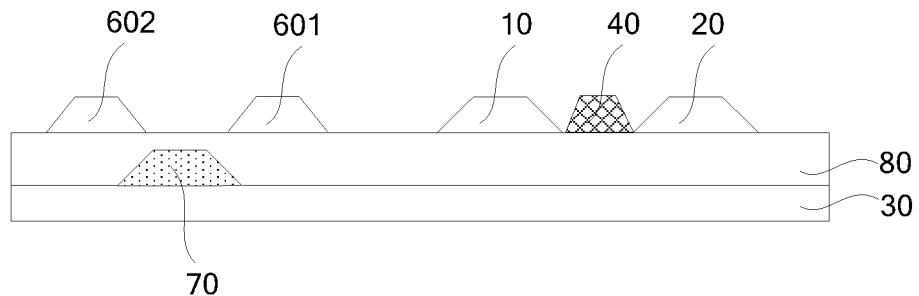
FIG. 12 is yet still another schematic diagram showing a structure of an array substrate provided by some embodiments of the present disclosure.

In some embodiments of the present disclosure, referring to FIG. 12, the above array substrate further includes: a source electrode 601 and a drain electrode 602 which are disposed in the same layer as the first metal trace 10 and the second metal trace 20, the source electrode 601 being electrically connected to the first metal trace 10; and the gate electrode 70 and the gate insulator 80 disposed on one side of the first metal trace 10 and the second metal trace 20 close to the base substrate 30. The gate electrode 70 is disposed to be closer to the base substrate 30.

The above thin film transistor further includes an active layer (all figures of embodiments of the present disclosure do not show the active layer), and the active layer is in contact with both the source electrode 601 and the drain electrode 602.

Here, the active layer may be formed before forming the barrier wall 40; or the active layer may be formed after forming the barrier wall 40 and before forming the first metal trace 10 and the second metal trace 20; or the active layer may be formed after forming the first metal trace 10 and the second metal trace 20.

Here, the material of the gate electrode 70 is not limited, as long as it can be conductive.

Exemplarily, the material of the gate electrode 70 may be at least one of the elemental metal, the alloy, or the metal oxide.

The material of the gate insulator 80 is not limited, as long as it is an insulating material. For example, it may be at least one of silicon nitride, silicon oxide or silicon oxynitride.

In addition, the source electrode 601 is electrically connected to the first metal trace 10, and the first metal trace 10 is a data line.

It will be noted that, in the embodiments of the present disclosure, the source electrode 601 and the drain electrode 602 are disposed on the gate electrode 70 and the gate insulator 80, and the formed thin film transistor is a bottom-gate type thin film transistor. But the embodiments of the present disclosure do not limit to this, and the thin film transistor in the above array substrate may also be the top-gate type thin film transistor.

When the thin film transistor is the top-gate type thin film transistor, the gate insulator 80 and the gate electrode 70 are formed on the source electrode 601 and the drain electrode 602 in sequence.

In some embodiments, since the source electrode 601 and the drain electrode 602 are disposed in the same layer as the first metal trace 10 and the second metal trace 20, the first metal trace 10, the second metal trace 20, the source electrode 601 and the drain electrode 602 may be formed simultaneously to simplifies the manufacturing process of the array substrate.

Further, referring to FIG. 11, the above array substrate further includes the buffer layer 90, the planarization layer 100, the first electrode 110, the passivation layer 120 and the second electrode 130 sequentially disposed on the first metal trace 10 and the second metal trace 20. The first electrode 110 is electrically connected to the second metal trace 20 via a via hole passing through the buffer layer 90 and the planarization layer 100. The second electrode 130 is electrically connected to the drain electrode 602 via a via hole passing through the passivation layer 120, the planarization layer 100 and the buffer layer 90.

The materials of the buffer layer 90, the planarization layer 100 and the passivation layer 120 are insulating materials.

The material of the buffer layer 90 may be, for example, at least one of $SiO_2$, $TiO_2$, or $CeO_2$.

The material of the planarization layer 100 may be, for example, resin.

The material of the passivation layer 120 may be, for example, at least one of silicon nitride, silicon oxide or silicon oxynitride.

It will be noted that, the first electrode 110 and the second electrode 130 may be, for example, transparent electrodes, and materials of the first electrode 110 and the second electrode 130 may be, for example, at least one of ITO, IZO or FTO.

The material of the second electrode 130 and the material of the first electrode 110 may be the same or different.

When the array substrate is an array substrate of the liquid crystal display device, the first electrode 110 may be a common electrode (Vcom). The second electrode 130 is electrically connected to the drain electrode 602, and the second electrode 130 is a pixel electrode.

In addition, the first electrode 110 is constituted by a plurality of bulk-shaped sub-electrodes, and the first electrode 110 may be used to implement both display and touch functions by time-multiplexing the first electrode 110.

The first electrode 110 is electrically connected to the second metal trace 20. The second metal trace 20 is a touch signal line, and is used to transmit a touch signal to the first electrode 110.

Here, the second electrode 130 may be electrically connected to the drain electrode 602 through a gap between the bulk-shaped sub-electrodes in the first electrode 110.

In some embodiments of the present disclosure, the touch electrode (i.e. the first electrode 110) is built-in to the array substrate to form an In-cell touch substrate, thereby reducing a thickness of the array substrate.

Some embodiments of the present disclosure further provide a display device, which includes the array substrate described above.

The display device may be a liquid crystal display device, or an organic light-emitting diode display device.

When the display device is specifically the liquid crystal display device, in addition to the array substrate, the display device may further include an opposite substrate for bonding with the array substrate to form a cell, and a liquid crystal layer disposed between the array substrate and the opposite substrate.

When the display device is an organic light-emitting diode display device, an organic light-emitting layer is also formed in the above array substrate. The display device may also include a packaging substrate used to package the above array substrate.

In addition, the above display device provided by the embodiments of the present disclosure may be any device that displays an image a moving image (for example, video) or fixed image (for example, still image), or a literal image or graphical image. More explicitly, it is contemplated that the described embodiments can be implemented in or associated with a variety of electronic devices. The variety of the electronic devices may include (but not limit to), for example, mobile telephones, wireless devices, portable android devices (PAD), hand-held or portable computers, global positioning system (GPS) receivers/navigators, cameras, MPEG-4 Part 14 (MP4) video players, a vidicon, game consoles, watches, clocks, calculators, TV monitors, flat panel displays, computer monitors, car displays (such as odometer display etc.), navigators, cockpit controllers and/or displays, camera view displays (such as rear view camera display in a vehicle), electronic photos, electronic billboards or signages, projectors, building structures, packaging and aesthetic structures (such as a display for an image of a piece of jewelry) etc. In addition, the display device may also be a display panel.

Exemplarily, embodiments of the present disclosure provide a display device. Since the barrier wall 40 is formed on the base substrate 30 before the first metal trace 10 and the second metal trace 20 are formed, and the width of the barrier wall 40 is less than or equal to the distance between the first metal trace 10 to be formed and the second metal trace 20 to be formed, when a conductive thin film (the conductive thin film is used to form the first metal trace 10 and the second metal trace 20 by etching) is further formed, the height of the portion of the conductive thin film covering the barrier wall 40 is higher than that of other regions of conductive thin film. Therefore, in the exposure process, the exposure of the portion of the photoresist in the region directly facing the barrier wall 40 may be enhanced, and thus the portion of the photoresist in the region directly facing the barrier wall 40 is sufficiently exposed, thereby solving the problem of insufficient exposure of the portion of the photoresist at the space between the first metal trace 10 to be formed and the second metal trace 20 to be formed.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A method for manufacturing an array substrate, the method comprising:
    forming an insulating thin film on a base substrate;
    forming strip-shaped barrier wall(s) with the insulating thin film via a patterning process, wherein, a width of each barrier wall is less than or equal to a distance between a first metal trace to be formed and a second metal trace to be formed;
    forming a conductive thin film on the base substrate on which the barrier wall(s) have been formed, and
    forming the first metal trace with the conductive thin film at one side of each barrier wall located in a direction perpendicular to an extending direction of the barrier wall, and forming the second metal trace with the conductive thin film at an opposite side of the barrier wall located in the direction perpendicular to the extending direction of the barrier wall via coating photoresist, exposure, development and etching processes, wherein
    forming the first metal trace and the second metal trace via the coating photoresist, the exposure, the development and the etching processes, includes: forming the first metal trace at the one side of the barrier wall and the second metal trace at the opposite side of the barrier wall, source electrodes and drain electrodes, which are located in the direction perpendicular to the extending direction of the barrier wall, via the coating photoresist, the exposure, the development and the etching processes, wherein each source electrode is electrically connected to a corresponding first metal trace.

2. The method for manufacturing the array substrate according to claim 1, wherein,
    each barrier wall has a continuous structure;
    or,
    each barrier wall includes at least two sub-barrier walls spaced apart, and the at least two sub-barrier walls are arranged in a strip shape.

3. The method for manufacturing the array substrate according to claim 1, wherein,
    forming the insulating thin film on the base substrate via the patterning process, and forming the strip-shaped barrier wall(s) via the patterning process, includes:
    forming the insulating thin film on the base substrate, and thinning partial regions of the insulating thin film, wherein portion(s) of un-thinned remaining regions of the insulating thin film, which are protruded as compared to the regions that are thinned, form the strip-shaped barrier wall(s).

4. The method for manufacturing the array substrate according to claim 1, wherein, a width of the barrier wall is equal to a distance between the first metal trace and the second metal trace.

5. The method for manufacturing the array substrate according to claim 1, wherein, a thickness of the barrier wall is less than or equal to a thickness of the first metal trace and a thickness of the second metal trace.

6. The method for manufacturing the array substrate according to claim 1, wherein, before forming the insulating thin film on the base substrate, the method further comprises:

forming gate electrodes and a gate insulator on the base substrate in sequence;

after forming the first metal trace and the second metal trace, the method further comprises:

forming a buffer layer and a planarization layer on the first metal trace and the second metal trace in sequence;

forming first electrodes on the planarization layer, and each first electrode is electrically connected to a corresponding second metal trace via a via hole passing through the buffer layer and the planarization layer;

forming a passivation layer on the first electrodes;

forming second electrodes on the passivation layer, and each second electrode is electrically connected to a corresponding drain electrode via a via hole passing through the passivation layer, the planarization layer and the buffer layer.

7. An array substrate manufactured by the method according to claim 1, the array substrate comprising:

the base substrate;

the insulating thin film disposed on a surface of the base substrate, wherein thicknesses of partial regions of the insulating thin film are less than thickness of remaining regions of the insulating thin film, and portion(s) of the remaining regions which are protruded as compared with the partial regions form the strip-shaped barrier wall(s);

first metal traces and second metal traces disposed on surfaces of the partial regions, which are all disposed on the base substrate;

the strip-shaped barrier wall(s) each disposed between one of the first metal traces and a corresponding one of the second metal traces; and the source electrodes and the drain electrodes which are disposed on a same layer as the first metal traces and the second metal traces, wherein the width of each barrier wall is less than or equal to the distance between the one of the first metal traces and the corresponding one of the second metal traces; and each source electrode is electrically connected to a corresponding first metal trace.

8. The array substrate according to claim 7, wherein, each barrier wall has a continuous structure;

or, each barrier wall includes at least two sub-barrier walls spaced apart, and the at least two sub-barrier walls are arranged in a strip shape.

9. The array substrate according to claim 7, wherein, the width of each barrier wall is equal to the distance between the one of the first metal traces and the corresponding one of the second metal traces.

10. The array substrate according to claim 7, wherein the array substrate further comprises:

gate electrodes and a gate insulator which are disposed at one side of each first metal trace close to the base substrate and one side of each second metal trace close to the base substrate, wherein, the gate electrodes are disposed to be close to the base substrate.

11. The array substrate according to claim 10, wherein the array substrate further comprises:

a buffer layer, a planarization layer, first electrodes, a passivation layer and second electrodes sequentially disposed on the first metal traces and the second metal traces, wherein the first electrodes are electrically connected to the second metal traces via via holes passing through the buffer layer and the planarization layer; the second electrodes are electrically connected to the drain electrodes via via holes passing through the passivation layer, the planarization layer and the buffer layer.

12. A display device, comprising the array substrate according to claim 7.

* * * * *